United States Patent
Ishikawa (10) Patent No.: US 8,400,613 B2
(45) Date of Patent: Mar. 19, 2013

(54) OPTICAL ELEMENT DRIVING APPARATUS, PROJECTION OPTICAL SYSTEM, EXPOSURE APPARATUS AND DEVICE MANUFACTURING METHOD

(75) Inventor: Mitsuo Ishikawa, Kounosu (JP)

(73) Assignee: Nikon Corporation, Tokyo (JP)

( * ) Notice: Subject to any disclaimer, the term of this patent is extended or adjusted under 35 U.S.C. 154(b) by 709 days.

(21) Appl. No.: 11/919,081

(22) PCT Filed: Apr. 27, 2006

(86) PCT No.: PCT/JP2006/308899
§ 371 (c)(1),
(2), (4) Date: Oct. 23, 2007

(87) PCT Pub. No.: WO2006/120927
PCT Pub. Date: Nov. 16, 2006

(65) Prior Publication Data
US 2009/0051889 A1 Feb. 26, 2009

(30) Foreign Application Priority Data
May 2, 2005 (JP) ................... 2005-134225

(51) Int. Cl.
G03B 27/42 (2006.01)
G02B 7/02 (2006.01)
(52) U.S. Cl. .......................... 355/53; 359/811
(58) Field of Classification Search .......... 355/53, 355/67; 359/811–823
See application file for complete search history.

(56) References Cited

U.S. PATENT DOCUMENTS

| | | | |
|---|---|---|---|
| 5,823,307 A | 10/1998 | Schubert et al. | |
| 6,327,026 B1* | 12/2001 | Wakui | 355/72 |
| 6,700,715 B2 | 3/2004 | Sorg et al. | |
| 6,788,386 B2* | 9/2004 | Cox et al. | 355/53 |
| 7,145,270 B2* | 12/2006 | Mizuno | 310/12.19 |
| 7,187,106 B2* | 3/2007 | Fuse et al. | 310/328 |
| 2002/0075574 A1 | 6/2002 | Sorg et al. | |
| 2002/0149754 A1 | 10/2002 | Auer et al. | |
| 2003/0197914 A1 | 10/2003 | Cox et al. | |
| 2004/0212794 A1 | 10/2004 | Mizuno | |
| 2005/0035684 A1 | 2/2005 | Fuse et al. | |

FOREIGN PATENT DOCUMENTS

| | | |
|---|---|---|
| EP | 1 321 822 A1 | 6/2003 |
| JP | A-03-263810 | 11/1991 |
| JP | A-11-044834 | 2/1999 |
| JP | A-2002-343712 | 11/2002 |
| JP | A-2003-124095 | 4/2003 |
| JP | A-2003-203860 | 7/2003 |
| JP | A-2004-340372 | 12/2004 |
| JP | A-2005-064474 | 3/2005 |
| WO | WO 99/49504 A1 | 9/1999 |

OTHER PUBLICATIONS

Feb. 16, 2010 European Search Report issued in Application No. 06732450.9.

(Continued)

*Primary Examiner* — Hung Henry Nguyen
(74) *Attorney, Agent, or Firm* — Oliff & Berridge, PLC (57) ABSTRACT

An outer ring (21) is arranged in a barrel unit (14*c*). A driving mechanism (25) provided on the outer ring shifts an optical element (M), and adjusts the position and the tilt of the optical element. A damper mechanism (31) for suppressing propagation of vibration to the optical element is attached to the outer ring.

15 Claims, 6 Drawing Sheets

OTHER PUBLICATIONS

Aug. 3, 2010 Notification of Reasons for Rejection issued in corresponding Japanese Patent Application No. 2007-528232 (with translation).

Nov. 10, 2011 Office Action issued in European Patent Application No. 06 732 450.9.

* cited by examiner

Fig.8

OPTICAL ELEMENT DRIVING APPARATUS, PROJECTION OPTICAL SYSTEM, EXPOSURE APPARATUS AND DEVICE MANUFACTURING METHOD

TECHNICAL FIELD

The present invention relates to an optical element driving apparatus for driving an optical element in an exposure apparatus that is used during a lithography process in a manufacturing process for a device, such as a semiconductor device and a liquid crystal display device, and a manufacturing process for a mask, such as a reticle and a photomask. The present invention also relates to a projection optical system and exposure apparatus including an optical element driving apparatus and a method for manufacturing a device with an exposure apparatus.

BACKGROUND ART

Generally, in a lithography process for manufacturing devices, such as a semiconductor device or a liquid crystal display device, an exposure apparatus is used to transfer a predetermined pattern formed in a mask, such as a reticle or a photomask, onto a substrate, such as a wafer or a glass plate, to which resist is applied, via projection optical system. The transferred pattern is miniaturized to satisfy the demand for higher integration. Thus, in addition to improving the exposure accuracy and resolution of an exposure apparatus, the alignment accuracy of optical elements that are included in the exposure apparatus must also be improved.

However, in an exposure apparatus of the prior art, vibrations generated inside and outside the exposure apparatus may be transmitted to optical elements (lenses, mirrors, etc.) included in the exposure apparatus. The transmission of vibrations may change the positions or attitudes of the optical elements and thereby lower the alignment accuracy of the optical elements. Therefore, an exposure apparatus including a damper mechanism having a vibration damping function has been proposed. Refer to, for example, Patent Document 1.

In the exposure apparatus described in Patent Document 1, an intermediate block is supported on a fixed block, which serves as a fixed portion fixed in a projection optical system, by an position adjustment mechanism including a parallel link mechanism. The intermediate block holds optical elements. The position adjustment mechanism adjusts the position and tilt of the intermediate block with six degrees of freedom. The position adjustment mechanism drives and moves the optical elements together with the intermediate block. This adjusts the position and tilt of the optical elements.

The intermediate block supports an additional mass via a bearing. The intermediate block faces toward the additional mass in a state spaced from the additional mass. A plurality of magnets are arranged on the opposing surfaces of the intermediate block and the additional mass so that they attract one another. A conductor plate supported by the fixed block (or the intermediate block) is arranged between the magnets of the intermediate block and the magnets of the additional mass. During the propagation of vibrations, the conductor plate and the magnets move relative to one another and generate eddy current. The eddy current is used to generate force for damping the vibrations. Thus, the conductor plate and the magnets function as a magnetic damper.

Patent Document 1: Japanese Laid-Open Patent Publication No. 2004-340372 (US Patent Application Publication No. 2004/212794).

DISCLOSURE OF THE INVENTION

In the exposure apparatus described in Patent Document 1, a plurality of magnets are fixed to the intermediate block and the additional mass. The conductor plate facing the magnets is supported by the fixed block or supported by the intermediate block or by the additional mass together with the magnets. That is, in the exposure apparatus of Patent Document 1, the damper mechanism (magnetic damper) is either arranged so as to extend across the intermediate block (movable portion) and the fixed block (fixed portion) or arranged only on the intermediate block (movable portion).

Therefore, when the position adjustment mechanism adjusts the position and tilt of the optical elements, the exposure apparatus of Patent Document 1 causes the problems described below.

(i) The position adjustment mechanism is required to drive the additional mass and the magnets in addition to the optical elements. This causes the driving load (weight) on the position adjustment mechanism to become excessively high and makes it difficult to adjust the position and tilt of the optical elements with high accuracy.

(ii) Especially in a state in which the damper mechanism is arranged extending across the intermediate block and the fixed block, when the position adjustment mechanism moves the intermediate block and the additional mass, relative movement occurs between the magnets fixed to the intermediate block and the conductor plate supported on the fixed block. In this case, in the conductor plate, a damping force acting in an direction opposite the direction of the relative movement is generated by the conductor plate. The damping force affects the inherent driving force of the position adjustment mechanism, which is driven to adjust the position and tilt of the optical elements, and makes the adjustment of the position and tilt of the optical elements further difficult.

It is an object of the present invention to provide an optical element driving apparatus capable of adjusting at least either one of the position and tilt of optical elements in a satisfactory manner and improving the positioning accuracy of the optical elements while effectively suppressing the propagation of vibrations to the optical elements, to provide a projection optical system including the optical element driving apparatus, to provide an exposure apparatus including the projection optical system, and to provide a method for manufacturing a device with the exposure apparatus.

To achieve the above object, one aspect of the present invention provides an optical element driving apparatus including a fixed portion. A drive mechanism moves an optical element to adjust at least either one of the position and the tilt of the optical element relative to the fixed portion. A damper mechanism is arranged on the fixed portion to suppress propagation of vibrations to at least one of the optical element and the drive mechanism.

In one embodiment, the damper mechanism includes a mass body, a resilient body that supports the mass body in a manner movable relative to the fixed portion, and a vibration suppressing member that suppresses movement of the mass body when the resilient body is resiliently deformed.

In one embodiment, the damper mechanism further includes a casing defining a hermetic chamber for accommodating the mass body, the resilient body, and the vibration suppressing member.

In one embodiment, the damper mechanism includes a casing defining an hermetic chamber. A resilient body is arranged outside the casing and resiliently deformed when the fixed portion vibrates. A mass body is arranged in the hermetic chamber. A vibration suppressing member is arranged in the hermetic chamber between the mass body and the casing to absorb vibrations of the mass body. The mass body is in contact with only the vibration suppressing member.

In one embodiment, the optical element is attached to the fixed portion via the drive mechanism.

In one embodiment, the drive mechanism includes a parallel link mechanism having six degrees of freedom to drive the optical element in six directions relative to the fixed portion. The parallel link mechanism includes a plurality of link pairs, each formed by a set of two links, with the link pairs being attached to the fixed portion in a dispersed manner. The damper mechanism is one of a plurality of damper mechanisms fixed to the fixed portion in a dispersed manner. Each of the damper mechanisms is arranged between two adjacent link pairs of the drive mechanism.

In one embodiment, the drive mechanism and the damper mechanism are both fixed to the fixed portion, and the fixed portion is immovable when the drive mechanism moves the optical element.

In one embodiment, the damper mechanism is fixed to the fixed portion at a position spaced from the drive mechanism.

In one embodiment, the damper mechanism is fixed only to the fixed portion.

A further aspect of the present invention provides a projection optical system for projecting a predetermined pattern onto a substrate. The projection optical system includes an the above optical element driving apparatus that adjusts at least either one of the position and the tilt of the optical element.

In one embodiment, the projection optical system further includes a barrel unit that accommodates the optical element. The fixed portion is immovably fixed to part of the barrel unit.

One embodiment further includes a position adjustment member arranged between the barrel unit and the fixed portion to adjust the position of the fixed portion relative to the barrel unit.

In one embodiment, the fixed portion is a barrel unit accommodating the optical element.

One embodiment further includes a barrel unit accommodating the optical element. The damper mechanism is in contact with both the fixed portion and the barrel unit, and the fixed portion is attached to the barrel unit, via the damper mechanism.

The present invention further provides an exposure apparatus for exposing a predetermined pattern on a substrate with the above projection optical system. The present invention further provides a method for manufacturing a device including a lithography process for performing exposure with the exposure apparatus.

BEST MODE FOR CARRYING OUT THE INVENTION

Referring to FIGS. 1 to 5, a scanning exposure apparatus according to a first embodiment of the present invention will now be described. The scanning exposure apparatus is of a step-and-scan type and used to manufacture semiconductor devices.

Figure 1:
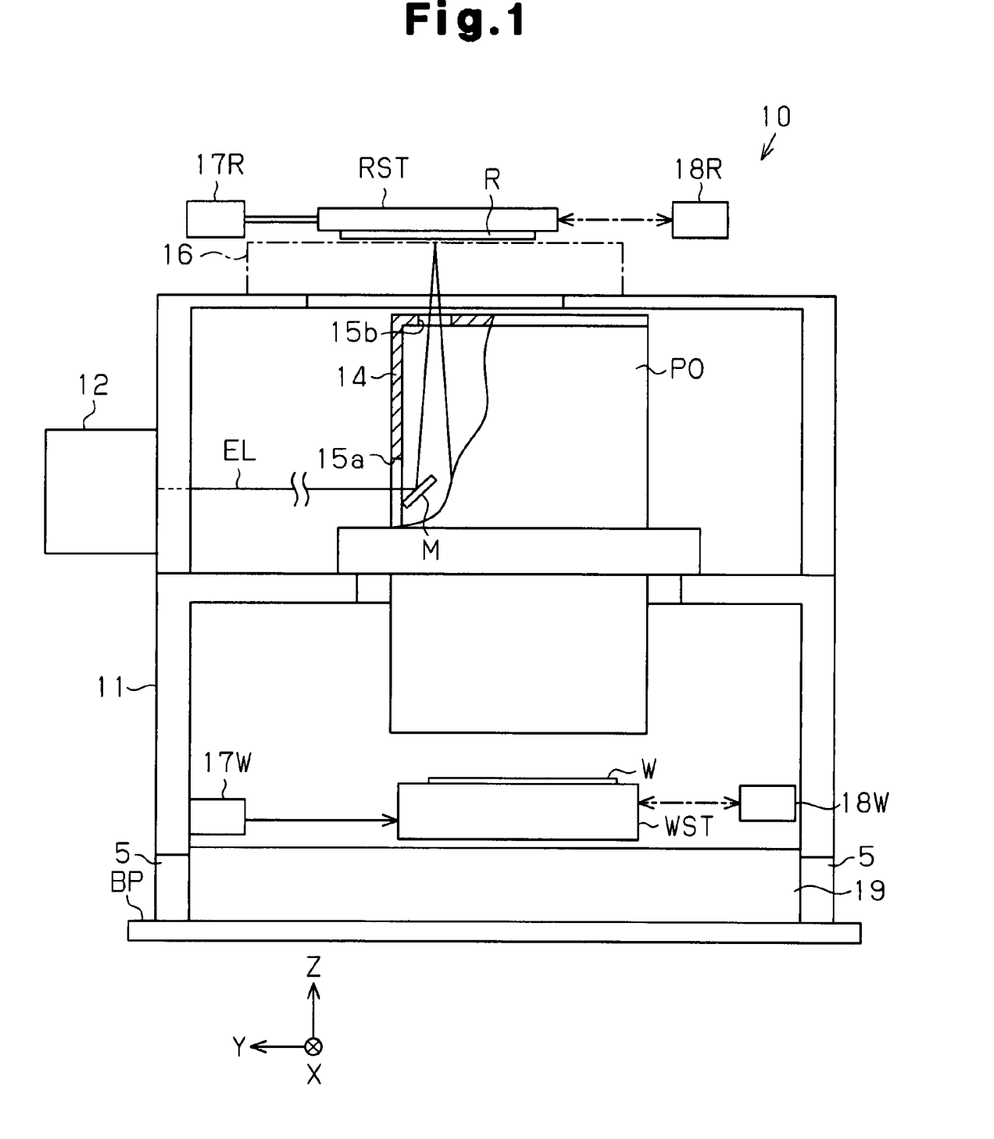
FIG. 1 is a schematic diagram showing an exposure apparatus according to a first embodiment of the present invention.

As shown in FIG. 1, an exposure apparatus 10 is arranged in an evacuatable vacuum chamber (not shown) and includes a column frame 11 assembled above a base plate BP. A light source 12 is arranged on one side (left side as viewed in FIG. 1) of the column frame 11. A projection optical system PO is arranged in a generally central part of the column frame 11. An illumination optical system, which is not shown, is arranged between the projection optical system PO and the light source 12.

A vibration isolator 5 is arranged between the base plate BP and the column frame 11. This reduces disturbance vibrations transmitted to the base plate BP from the floor on which the exposure apparatus 10 is placed. The light source 12 may be arranged independently from the column frame 11.

The light source 12 emits EUV exposure light (light having a soft X-ray wavelength) EL toward the illumination optical system. In one embodiment, the light source 12 emits the exposure light EL in a horizontal direction (the direction of Y-axis in FIG. 1). An example of the light source 12 is a laser excitation plasma light source which emits the exposure light EL mainly at a wavelength of 5 to 20 nm, for example, at a wavelength of 11 nm.

Figure 2:
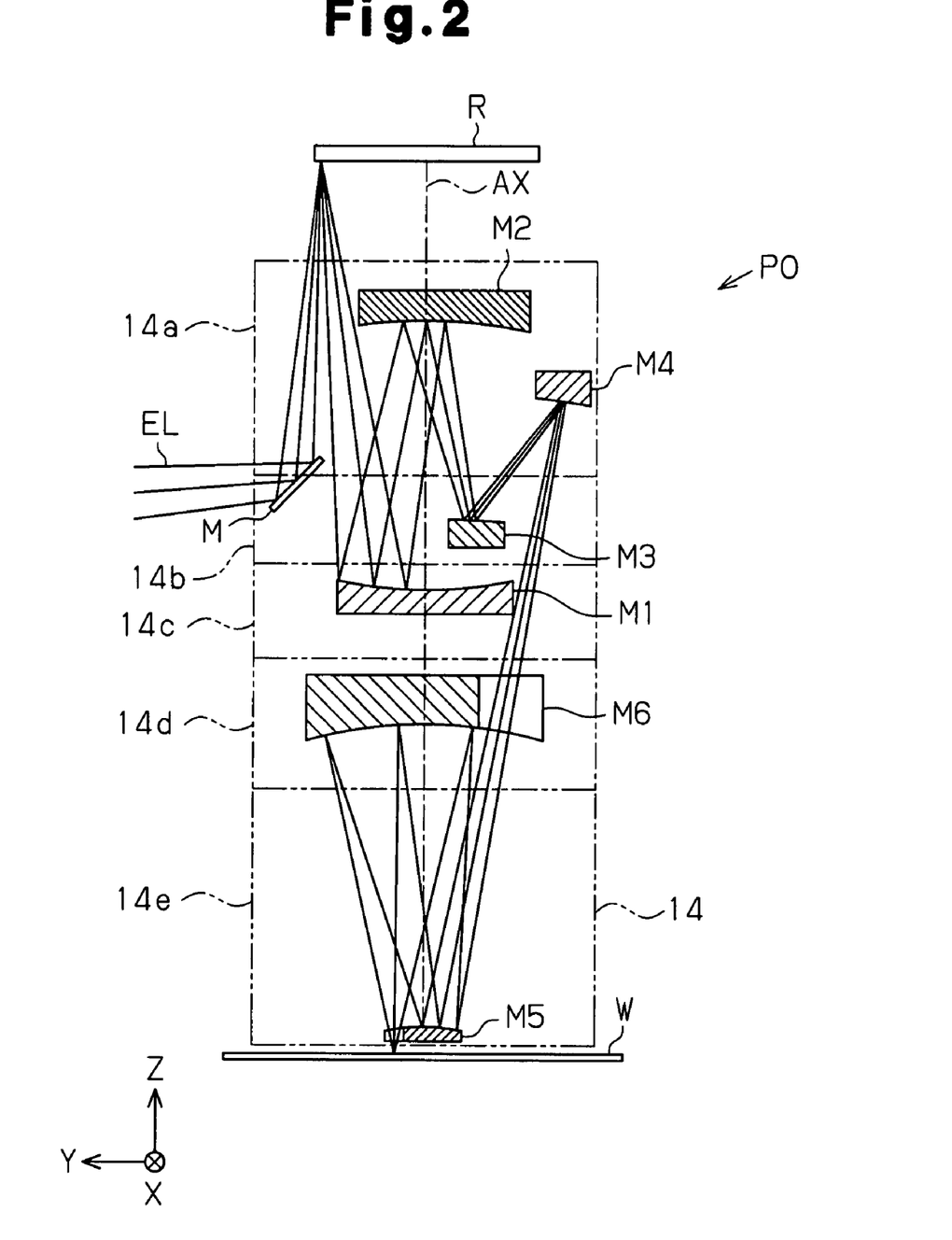
FIG. 2 is a schematic diagram showing the arrangement of mirrors forming a projection optical system.

As shown in FIG. 2, the projection optical system PO includes a barrel 14. The barrel 14 is formed by a plurality of (for example, five) barrel units 14a to 14e stacked along the direction of Z-axis, which is parallel to an optical axis AX of the projection optical system PO. A plurality of (for example, seven) mirrors (optical elements) M, M1 to M6 are accommodated in the barrel 14. Although arranged within the barrel 14 of the projection optical system PO, the mirror M is an optical element forming part of the illumination optical system. The six mirrors M1 to M6, which exclude the mirror M, are optical elements forming the projection optical system PO.

As shown in FIG. 2, the six mirrors M1 to M6 are arranged within the barrel 14 in the order of the mirror M2, the mirror M4, the mirror M3, the mirror M1, mirror M6, and the mirror M5 from the top downward. The mirrors M2 and M4 are accommodated in the top barrel unit 14a. The mirror M3 is accommodated in the second barrel unit 14b from the top. The mirror M1 is accommodated in the middle barrel unit 14c. The mirror M6 is accommodated in the second barrel unit 14d from the bottom. The mirror M5 is accommodated in the bottom barrel unit 14e. The mirrors M5 and M6 each have a cutaway portion located on an optical path of the exposure light EL.

As shown in FIG. 1, openings 15a and 15b are respectively formed in a side wall and an upper wall of the barrel 14. In one example, the opening 15a is a rectangular opening extending across the barrel unit 14a and the barrel unit 14b. The exposure light EL emitted from the light source 12 once enters the barrel 14 of the projection optical system PO through the opening 15a. The above-mentioned mirror M is arranged in the barrel 14 in the vicinity of the opening 15a. The mirror M reflects the incident exposure light EL in an upward direction. The exposure light EL is emitted out of the barrel 14 through the opening 15b.

As shown in FIG. 1, a reticle base plate 16 is arranged above the column frame 11 and parallel to the X-Y plane. A reticle stage RST is arranged above the reticle base plate 16 in a levitated state. The reticle stage RST is driven by a reticle stage drive unit 17R formed by, for example, a magnetic levitation type two-dimensional linear actuator. The reticle base plate 16 has an opening (not shown) for allowing passage of the exposure light EL emitted from the opening 15b.

A reflection-type reticle R having a patterned surface is arranged on the lower surface of the reticle stage RST with the patterned surface facing downward. A predetermined pattern (for example, a circuit pattern) is formed on the patterned surface. The reticle R is held by a reticle holder (not shown). The reticle stage drive unit 17R moves the reticle stage RST mainly in the directions of the X-axis and Y-axis. A reticle laser interferometer 18R constantly detects the position of the reticle stage RST.

A wafer base plate 19 is arranged in the lower part of the column frame 11 so as to extend along the X-Y plane. A wafer stage WST is arranged above the wafer base plate 19 in a levitated state. The wafer stage WST is driven by a wafer stage drive unit 17W formed by, for example, a magnetic levitation type two-dimensional linear actuator. A wafer (substrate) W having an upper surface to which resist is applied is held by a wafer holder (not shown) on the wafer stage WST. The wafer stage drive unit 17W moves the wafer stage WST mainly in the directions of the X-axis and Y-axis. A wafer laser interferometer 18W constantly detects the position of the wafer stage WST.

Figure 3:
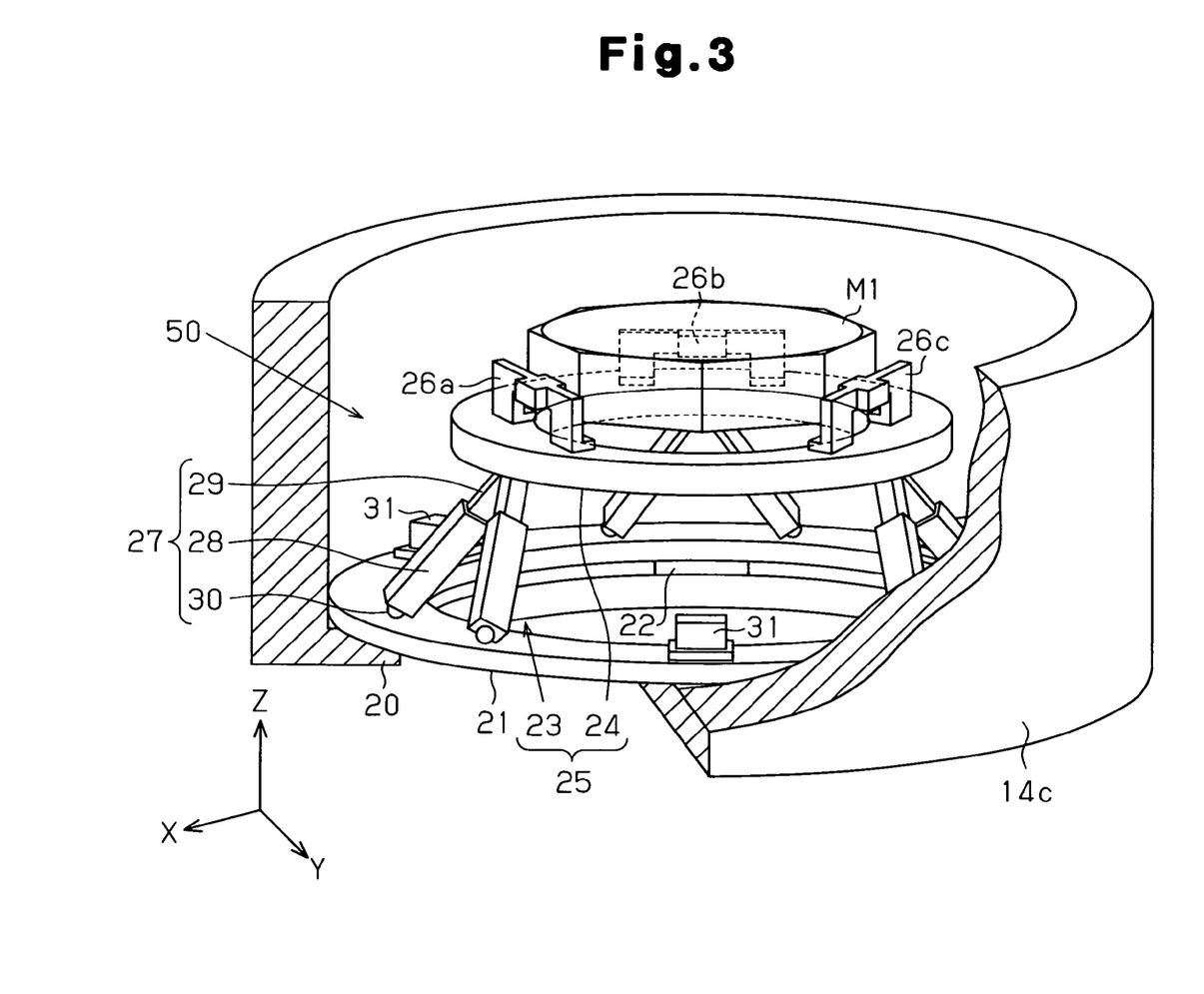
FIG. 3 is a partially cutaway perspective view showing a barrel unit included in the projection optical system.

Referring to FIG. 3, an optical element driving apparatus for adjusting the position and tilt of the mirrors M1 to M6 will be discussed.

FIG. 3 shows the middle barrel unit 14c of the barrel 14. A flange portion 20 extending horizontally inward is formed in a lower part of the barrel unit 14c. The flange portion 20 supports an annular outer ring (fixed portion) 21 via a plurality of adjustment washers 22 serving as position adjustment washers. The outer ring 21 is immovable relative to the flange portion 20 during the adjustment of the position and tilt of the mirror M1.

Figure 4:
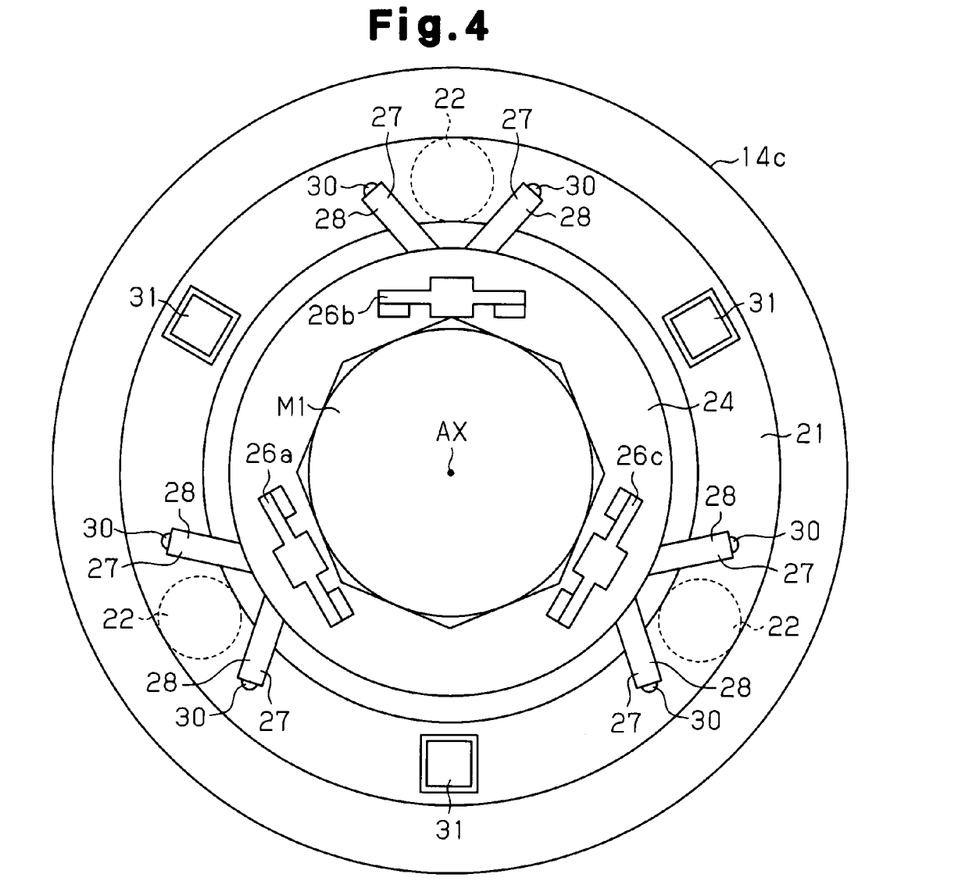
FIG. 4 is a plan view showing the barrel unit of FIG. 3.

As shown in FIG. 4, the plurality of adjustment washers 22 are arranged in a dispersed manner at equal angular intervals (for example, 120 degrees) to support the outer ring 21 at equally spaced points (for example, three trisection points) in the circumferential direction. In the present embodiment in which the adjustment of the position of the outer ring 21 relative to the flange portion 20 is enabled by adjusting the height of the adjustment washers 22, the outer ring 21 is adjusted to be horizontal to the flange portion 20.

A drive mechanism 25 including a parallel link mechanism 23 and an inner ring 24 is arranged on the outer ring 21. The parallel link mechanism 23 movably supports the inner ring 24. The inner ring 24 is annular. The mirror M1 is held on the inner ring 24 by a plurality of (for example, three) mirror holding members 26a, 26b and 26c. The parallel link mechanism 23 moves the inner ring 24 and adjusts at least either the position or the tilt of the mirror M1 with respect to the outer ring 21.

The parallel link mechanism 23 movably connects the inner ring 24 to the outer ring 21. The parallel link mechanism 23 drives the inner ring 24 in six different directions relative to the outer ring 21, that is, with six degrees of freedom. The six degrees of freedom refers to movements in the directions of the X-axis (Δx), the Y-axis (Δy), and the Z-axis (Δz), and rotations about the X-axis (θx), the Y-axis (θy), and Z-axis (θz). In the example shown in FIG. 3, the parallel link mechanism 23 is formed by three link pairs arranged in a dispersed manner on the outer ring 21. Each link pair includes a set of two links 27. The two ends of each link 27 are connected to the outer ring 21 and the inner ring 24 by a spherical pair.

Each link 27 has a first shaft member 28 and a second shaft member 29, which is connected or coupled to the first shaft member 28. One end (the lower end) of the first shaft member 28 is attached to the outer ring 21 by a ball joint 30. One end (the upper end) of the second shaft member 29 is attached to the inner ring 24 by a ball joint (not shown). At least one of the first shaft member 28 and the second shaft member 29 is provided with an actuator (for example, a piezoelectric element), which changes the length of the link 27 or the distance between the lower end of the first shaft member 28 and the upper end of the second shaft member 29. Therefore, the links 27 are each expandable and contractable.

As shown in FIGS. 3 and 4, a plurality of (for example, three) damper mechanisms 31 are arranged on the outer ring 21 in a dispersed manner at equal angular intervals (for example, 120 degrees). Each damper mechanism 31 is arranged between two adjacent link pairs. In the example shown in FIG. 4, the three damper mechanisms 31 and the three link pairs of the parallel link mechanism 23 are arranged at equal angular intervals (60 degree intervals). The damper mechanisms 31 and the drive mechanism 25 form an optical element driving apparatus 50.

Figure 5:
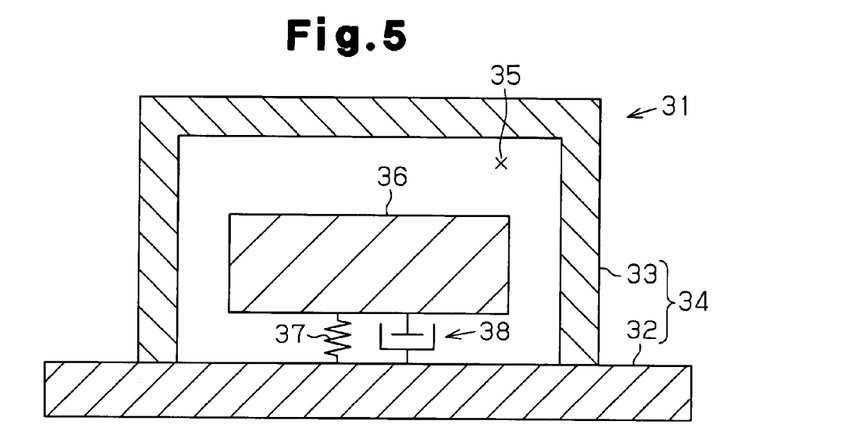
FIG. 5 is a schematic diagram showing a damper mechanism.

As shown in FIG. 5, each damper mechanism 31 includes a rectangular base member 32, which is fixed to the outer ring 21, and a cover 33, which is fixed to the base member 32. The base member 32 and the cover 33 function as a casing 34 defining a hermetic chamber 35, which is in an atmospheric-pressure atmosphere. An hermetic seal member is arranged between the base member 32 and the cover 33 to improve the hermetic seal. Each damper mechanism 31 further includes a mass body 36 having a predetermined mass, a resilient body 37 having an isolator function, and a vibration suppressing member 38 having a damper function, which are accommodated in the hermetic chamber 35. The resilient body 37 having the isolator function may be, for example, a spring. The vibration suppressing member 38 having the damper function may be, for example, a rubber foam. The spring 37 and the rubber foam 38 support the mass body 36 in a levitated state in the casing 34. When the outer ring 21 vibrates, the mass body 36 is inertially moved in the direction of the vibration as the spring 37 resiliently deforms. Then, the movement in the direction of the vibration is dampened by the rubber foam 38.

In the other barrel units 14a, 14b, 14d, and 14e excluding the barrel unit 14c, the mirrors M2 to M6 are respectively supported on the outer rings 21, serving as the fixed portions, by the drive mechanisms 25 so that at least one of the position and the tilt is adjustable in the same manner as in the barrel unit 14c. Three damper mechanisms 31 are arranged on each outer ring 21 between the three link pairs of the parallel link mechanism 23 in the drive mechanism 25.

The operation of the exposure apparatus 10 will now be discussed.

Exposure light EL emitted from the light source 12 enters the barrel 14 of the projection optical system PO through the opening 15a formed in the barrel 14. The exposure light EL is then reflected upward by the mirror M through the opening 15b of the barrel 14 to strike the reticle R at a predetermined incident angle. The exposure light EL forms an arcuate slit-shaped illumination light that illuminates the patterned surface of the reticle R.

The exposure light EL reflected by the patterned surface of the reticle R enters the barrel 14 of the projection optical system PO again. As shown in FIG. 2, the exposure light EL is sequentially reflected by the mirrors M1, M2, M3, M4 and M5 and converged at the mirror M6 to be emitted toward the wafer W. Accordingly, a predetermined pattern (such as a circuit pattern) formed on the reticle R is transferred to each of a plurality of shot regions on the wafer in accordance with the step-and-scan technique.

For example, when a building (not shown) in which the exposure apparatus 10 is placed vibrates, or when the column frame 11 vibrates as the wafer stage WST or the reticle stage RST is driven, the vibration isolator 5 will reduce the vibrations. However, slight vibrations that would affect the exposure accuracy may be propagated to the barrel 14 of the projection optical system PO. In the case of the barrel unit 14c shown in FIG. 3, for example, this would vibrate the outer ring 21 supported on the flange portion 20 via the adjustment washers 22. However, the vibrations of the outer ring 21 are dampened by the damper mechanisms 31. Thus, the vibrations are not propagated to the mirror M1 through the drive mechanism 25.

The vibration damping function of the damper mechanisms 31 will now be discussed.

In each damper mechanism 31, the mass body 36 in the casing 34 is inertially moved in the direction suppressing the vibration of the outer ring 21 while resiliently deforming the spring 37 along as the outer ring 21 vibrates. The rubber foam 38 absorbs movement energy of the mass body 36 relative to the outer ring 21. This gradually reduces the movement amount of the mass body 36. As a result, the vibrations propagated from the barrel 14 (barrel unit 14c) to the outer ring 21 is prevented from being further propagated to the mirror M1 from the outer ring 21 through the drive mechanism 25.

The barrel 14 (barrel units 14a to 14e) of the exposure apparatus 10 contains an inert gas or vacuum atmosphere. In the first embodiment, the damper mechanism 31 has the casing 34 with the hermetic chamber 35, and the hermetic chamber 35 of the casing 34 accommodates the main components of the damper mechanism 31, namely, the mass body 36, the spring 37, and the rubber foam 38. Therefore, there is no gas exchange between the interior of the barrel 14 and the hermetic chamber 35 of the casing 34. This prevents the functions of the barrel 14 and the hermetic chamber 35 from deteriorating and does not affect, for example, the atmosphere of the barrel 14 and the hermetic chamber 35.

The exposure apparatus 10 of the first embodiment has the advantages described below.

(1) Even if vibrations from the outer side (a building or the like) or the inner side (the wafer stage WST or the like) of the exposure apparatus 10 is transmitted to the barrel 14 of the projection optical system PO, the vibrations are prevented from propagating to the mirrors M1 to M6 through the outer ring 21 since the damper mechanisms 31 arranged on the outer ring 21 function to dampen vibrations and inhibit the propagation of vibrations to the mirrors M1 to M6. This eliminates changes in the position or tilt of the mirrors M1 to M6 that would be caused by such vibrations. Thus, the positioning accuracy of the mirrors M1 to M6 in the projection optical system PO is prevented from being lowered in an optimal manner.

(2) The damper mechanism 31 is supported by the outer ring 21, which serves as a fixed portion. Therefore, no load will be applied by the weight of the damper mechanism 31 when the drive mechanism 25 is driven to adjust the position and tilt of the mirrors M1 to M6 of the projection optical system PO. Accordingly, the projection optical system PO adjusts the position and tilt of the mirrors M1 to M6 with the drive mechanism 25 in a satisfactory manner.

(3) The damper mechanism 31 has a simple structure formed by the mass body 36 having a predetermined mass, the spring 37 for movably supporting the mass body 36, and the rubber foam 38 for reducing the movement (vibration) of the mass body 36 in the movement suppressing direction when the spring 37 is resiliently deformed. Thus, the damper mechanism 31 having a satisfactory damping function is obtained at a low cost.

(4) The main components of the damper mechanism 31, namely the mass body 36, the spring 37, and the rubber foam 38 are accommodated in the hermetic chamber 35 of the casing 34. Therefore, there is no gas exchange between the interior of the damper mechanism 31 and the interior of the barrel 14. Accordingly, when selecting the materials for the components of the damper mechanism 31, there is no need to take into consideration the influence on the atmosphere in the barrel 14. This enables the materials of the components of the damper mechanism 31 (the mass body 36, the rubber foam 38 and so on) to be freely selected in accordance with the desired damping function.

(5) The parallel link mechanisms 23 in each optical element driving apparatus 50 drives the mirrors M1 to M6 in six directions with respect to the outer rings 21. This enables fine adjustment of at least either one of the position and the tilt of the mirrors M1 to M6 and improves the exposure accuracy.

(6) The damper mechanisms 31 are each arranged on the outer ring 21 between the three link pairs of the parallel link mechanism 23 in the drive mechanism 25. Therefore, the damper mechanisms 31 will not inhibit the movement of the links 27 of the parallel link mechanisms 23. This achieves a satisfactory driving state.

(7) The damper mechanisms 31 and the parallel link mechanism 23 are arranged on the outer ring 21 at equal angular intervals (60 degree intervals) around the optical axis AX of the projection optical system PO. This prevents the weight of the damper mechanisms 31 from biasing the center of gravity of the optical element driving apparatus 50 in the barrel units 14a to 14e.

A second embodiment of the present invention will now be described.

The second embodiment differs from the first embodiment only in the specific structure of the damper mechanism. The following description will be focused on the damper mechanism, and components that are the same as those of the first embodiment will be denoted by the same reference numerals and will not be described.

Figure 6:
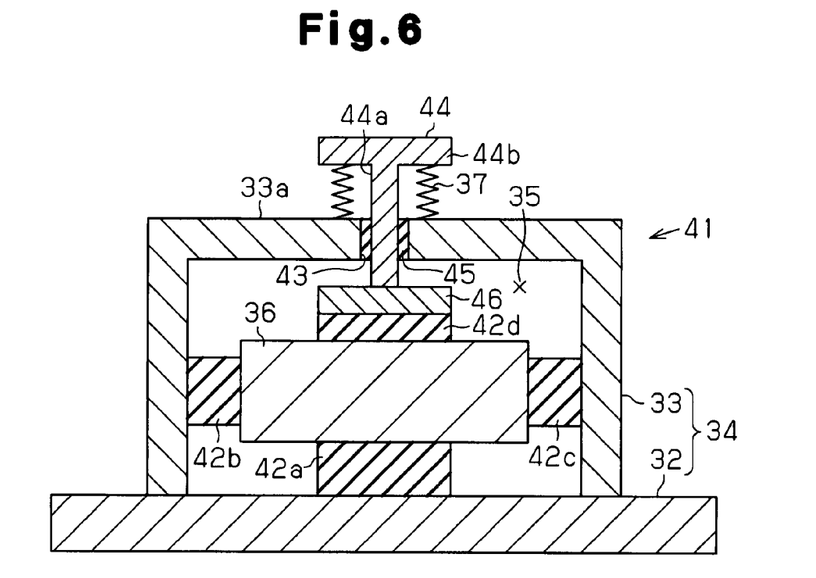
FIG. 6 is a schematic diagram showing a damper mechanism according to a second embodiment of the present invention.

As shown in FIG. 6, in a damper mechanism 41 of the second embodiment, a casing 34, which includes a rectangular base member 32 fixed on an outer ring 21 and a cover 33 fixed on the base member 32, defines an hermetic chamber 35 having an atmospheric-pressure atmosphere. For example, an hermetic seal member may be arranged between the base member 32 and the cover 33 to improve the hermetic seal. A mass body 36 having a predetermined mass is arranged in the hermetic chamber 35. A rubber body 42a is arranged between the mass body 36 and the base member 32 to suppress displacement of the mass body 36 in the vertical direction. Rubber bodies 42b and 42c are arranged between the mass body 36 and the side walls of the cover 33 to suppress displacement of the mass body 36 in the horizontal direction. A through hole 43 extends through an upper wall 33a of the cover 33. A pressing member 44, which includes a top plate portion 44b and a shaft 44a and has a T-shaped cross section, is supported movably with respect to the upper wall 33a of the cover 33. The shaft 44a of the pressing member 44 is inserted through the through hole 43. A seal member 45 is arranged between the shaft 44a and the through hole 43 to maintain the hermetic seal of the hermetic chamber 35.

In the hermetic chamber 35, a flat pressing plate 46, which is generally parallel to the top plate portion 44b, is fixed to the end of the shaft 44a of the pressing member 44. A rubber body 42d is arranged between the pressing plate 46 and the mass body 36 to suppress displacement of the mass body 36 in the vertical direction. The rubber bodies 42a to 42d each function as a vibration suppressing member having a damper function. In the example shown in FIG. 6, the mass body 36 is only in contact with the rubber bodies 42a to 42d. A resilient body 37 having an isolator function is arranged between the upper wall 33a of the cover 33 and the top plate portion 44b of the pressing member 44. The resilient body 37 may, for example, be a spring. When the outer ring 21 vibrates, the mass body 36 is moved in the direction of the vibration as the spring 37 resiliently deforms. The rubber bodies 42a to 42d gradually reduce the movement amount of the mass body 36. Accordingly, in the second embodiment, the same advantages as advantages (1) to (7) of the first embodiment are obtained.

Each embodiment may be modified as described below.

The damper mechanisms 31 and 41 may be arranged in the flange portion 20 of the barrel units 14a to 14e. In this case, part of each of the barrel units 14a to 14e (flange portion 20) functions as the fixed portion. The vibrations propagated to the barrel 14 is dampened by the damper mechanisms 31 or 41 provided in the barrel units 14a to 14e. Accordingly, the propagation of vibrations to the mirrors M1 to M6 is inhibited.

The outer ring 21 may be directly supported by the flange portion 20 without arranging the adjustment washers 22, which serve as position adjustment washers, between the flange portion 20 and the outer ring 21 in the barrel unit 14a to 14e.

Instead of the adjustment washers 22, the damper mechanisms 31 or 41 having the casing 34 may be arranged between part of the barrel unit 14a to 14e (flange portion 20) and the outer ring 21. In this case, the outer ring 21 serving as the fixed portion is attached to part of the barrel unit 14a to 14e by the damper mechanisms 31 and 41.

The drive mechanism 25 of the optical element driving apparatus 50 may adjust only one of the position and the tilt of the mirrors M1 to M6.

In the drive mechanism 25 of the optical element driving apparatus 50, the inner ring 24 may be eliminated, and the mirrors M1 to M6 may be directly supported by the link pairs of the parallel link mechanism 23.

The optical element driving apparatus 50 having the damper mechanisms 31 or 41 may adjust at least one of the mirrors M1 to M6 (for example, the mirror M1 in the barrel unit 14c) accommodated in the barrel units 14a to 14e of the barrel 14.

The quantity of the damper mechanisms 31 or 41 arranged on the outer ring 21 serving as the fixed portion in each of the barrel units 14a to 14e may be a number other than three (for example, the number may be one, two, or four or more). The damper mechanisms 31 and 41 may be arranged at intervals that are not equal angular intervals.

The hermetic chamber 35 in the casing 34 of the damper mechanisms 31 and 41 may contain a vacuum atmosphere instead of the atmospheric-pressure atmosphere. In this case, the damper mechanisms 31 and 41 are produced under the atmospheric-pressure atmosphere and then the pressure in the hermetic chamber 35 is reduced.

In the damper mechanism 31 of the first embodiment, the cover 33 may be omitted. In this case, the mass body 36 is supported on the base member 32, which is exposed to the interior of the barrel 14, by the spring 37 and the rubber foam 38.

The vibration suppressing member of the damper mechanisms 31 and 41 may be formed by a viscous material such as gel, oil, and grease instead of the rubber foam 38 or the rubber bodies 42a to 42d.

In each embodiment, the optical elements are not restricted to the mirrors M1 to M6 and may be other types of optical elements such as parallel plates, lenses, and half mirrors.

In each embodiment, the optical element driving apparatus 50 may be provided in the illumination optical system to drive optical elements of an optical system such as a microscope and an interferometer.

The projection optical system PO in the exposure apparatus 10 is not restricted to a reflection type, but may be of a catadioptric type or refraction type. The exposure apparatus 10 is not restricted to a reduction exposure type, but may be of an equal magnification exposure type or enlargement exposure type. Additionally, the exposure apparatus 10 may be of a step-and-repeat type.

The exposure light emitted from the light source 12 of the exposure apparatus 10 is not restricted to EUV light and may be g-line (436 nm), i-line (365 nm), KrF excimer laser (248 nm), $Kr_2$ laser (146 nm), ArF excimer laser (193 nm), $F_2$ laser (157 nm), $Ar_2$ laser (126 nm), or the like.

The exposure apparatus 10 may be an exposure apparatus which is used to manufacture a display such as a liquid crystal display device (LCD) to transfer a device pattern onto a glass plate, an exposure apparatus which is used to manufacture a thin-film magnetic head or the like to transfer a device pattern onto a ceramic wafer, or an exposure apparatus which is used to manufacture an imaging device such as a CCD. For example, the exposure apparatus 10 may be a liquid immersion type exposure apparatus disclosed in International Patent Publication WO99/49504.

The method for manufacturing a device in which the exposure apparatus 10 is used during a lithography process will now be described.

Figure 7:
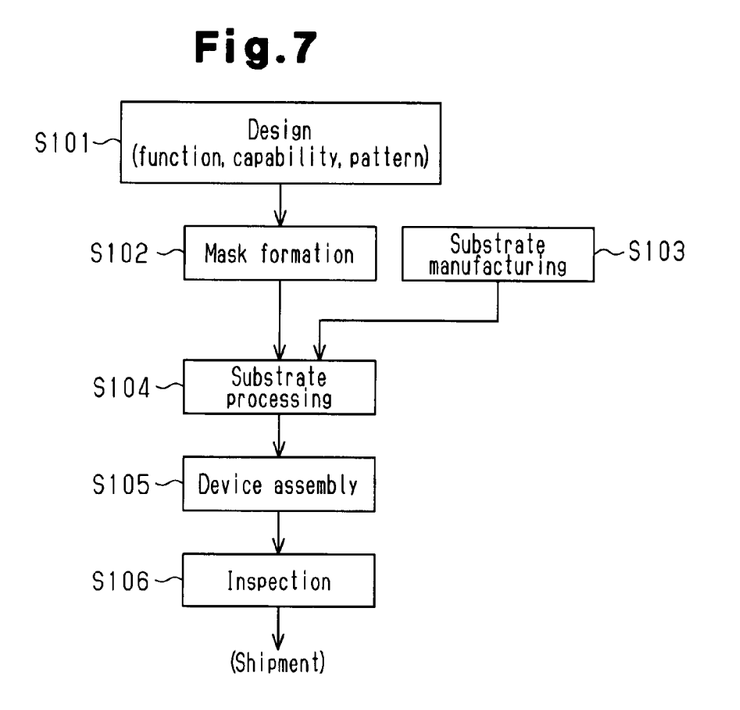
FIG. 7 is a flowchart showing device manufacturing operations.

FIG. 7 is a flowchart illustrating an example for manufacturing a device (for example, a semiconductor device such as an IC or an LSI, a liquid crystal display device, an imaging device (CCD or the like), a thin-film magnetic head, or a micromachine). As shown in FIG. 7, first, in step S101 (design step), the functions and performance of the device (microdevice) are designed (for example, the circuit of a semiconductor device is designed), and a pattern for realizing those functions is designed. Subsequently, in step S102 (mask preparation step), a mask on which the designed circuit pattern is formed (reticle R or the like) is prepared. In step S103 (substrate production step), a substrate is produced by using a material such as silicon or glass plate (a wafer W is produced when using a silicon material).

Next, in step S104 (substrate processing step), the mask and the substrate prepared in steps S101 to S103 are used to form an actual circuit or the like on the substrate through a lithography technique or the like as will be described later. Subsequently, in step S105 (device assembly step), a device is assembled by using the substrate processed in step S104. Step S105 may include other steps such as a dicing step, a bonding step, and a packaging step (chip encapsulation or the like), when necessary.

Finally, in step S106 (inspection step), the device produced in step S105 undergoes inspections such as an operation check test and a durability test. The device is completed through these steps and then shipped out of the factory.

Figure 8:
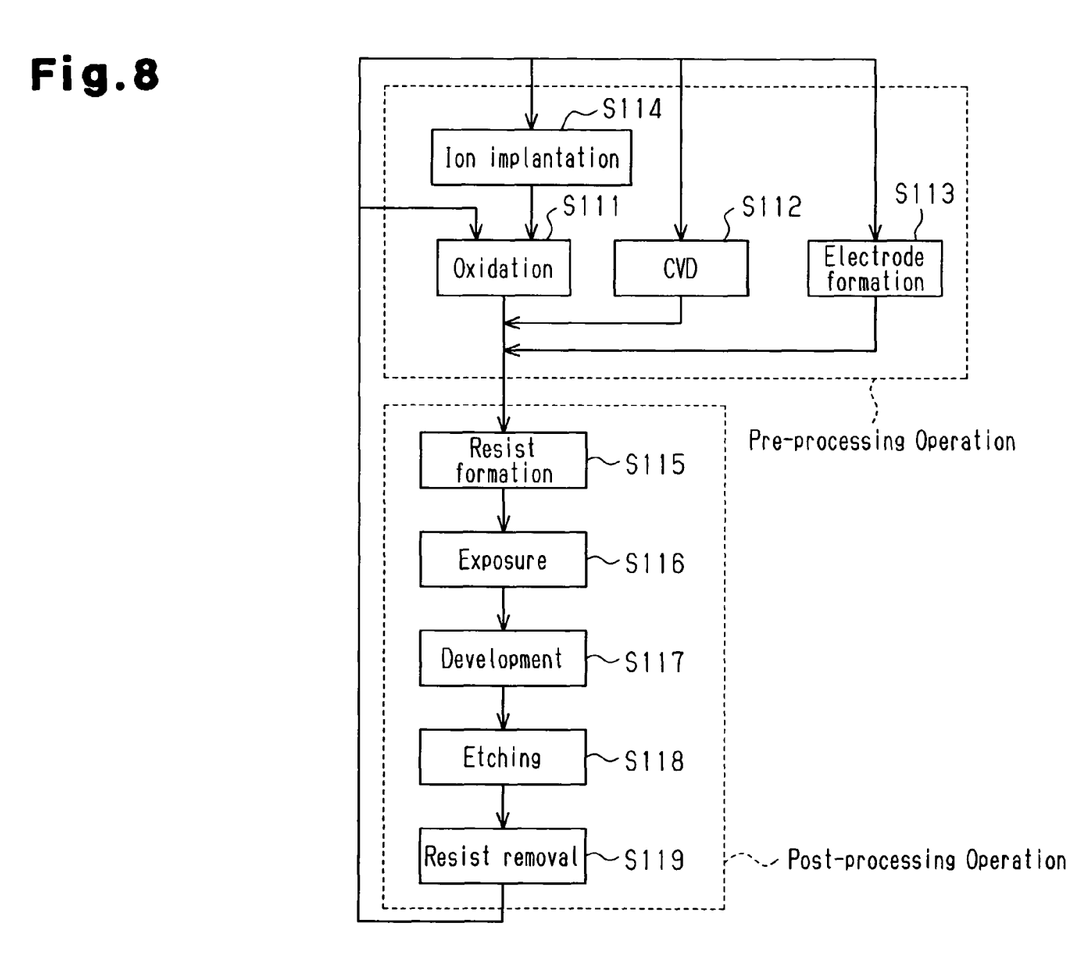
FIG. 8 is a flowchart showing semiconductor device manufacturing operations.

FIG. 8 is a flowchart illustrating in detail an example of a process of step S104 in FIG. 7 when manufacturing a semiconductor device. In FIG. 8, in step S111 (oxidation step), a surface of the wafer W is oxidized.

In step S112 (CVD step), an insulation film is formed on the surface of the wafer W. In step S113 (electrode formation step), an electrode is formed on the wafer W by performing vapor deposition. In step S114 (ion implantation step), ions are implanted in the wafer W. Steps S111 to S114 described above define a pre-processing operation for each stage of the wafer processing. These steps are selected and performed in accordance with the necessary processing in each stage.

Upon completion of the above-mentioned pre-processing operation in each stage of the wafer processing, a post-processing operation is performed in the following manner. In the post-processing operation, first, in step S115 (resist formation step), a photosensitizing agent is applied to the wafer W. Subsequently, in step S116 (exposure step), a circuit pattern of the mask (reticle R) is transferred onto the wafer W by the lithography system (the exposure apparatus 10) described above. Next, in step S117 (development step), the exposed wafer W is developed. In step S118 (etching step), the exposed member in the part other than the part where the resist remains is removed by etching. In step S119 (resist removal step), the resist that is no longer required after completion of the etching is removed.

The pre-processing operation and post-processing operation are repeatedly performed to form multiple circuit patterns on the wafer W. When using the device manufacturing method according to the embodiment as described above, the exposure apparatus 10 is used in the exposure process (step S116), and the exposure light in a vacuum ultraviolet region enables improvement of the resolution. Moreover, the amount of light exposure can be controlled with high accuracy. As a result, a highly integrated devices with a minimal line width of about 0.1 µm is manufactured with a high yield.

The invention claimed is:

1. An optical element driving apparatus comprising:
   an optical element;
   a drive mechanism that includes a parallel link mechanism configured to adjust at least either one of a position and a tilt of the optical element, the parallel link mechanism including a plurality of links each having a first end coupled to the optical element and a second end opposite to the first end;
   a damper mechanism having a mass body and configured to suppress propagation of vibrations to at least one of the optical element and the drive mechanism; and
   a fixed portion to which the second ends of the plurality of links are fixed, wherein
   the damper mechanism is fixed to the fixed portion at at least one intermediate position between the plurality of links that differs from the position to which the plurality of links are fixed.

2. The optical element driving apparatus according to claim 1, wherein:
   the parallel link mechanism drives the optical element in six directions relative to the fixed portion, and includes a plurality of link pairs, each formed by two of the plurality of links, with the link pairs being attached to the fixed portion in a dispersed manner; and
   the damper mechanism is one of a plurality of damper mechanisms fixed to the fixed portion in a dispersed manner, each of the damper mechanisms being arranged between two adjacent link pairs.

3. The optical element driving apparatus according to claim 2, wherein the damper mechanism is fixed to the fixed portion at a position spaced from the link pairs.

4. The optical element driving apparatus according to claim 1, wherein the fixed portion is immovable when the drive mechanism moves the optical element.

5. The optical element driving apparatus according to claim 4, wherein the damper mechanism is fixed only to the fixed portion.

6. A projection optical system that projects a predetermined pattern onto a substrate, the projection optical system comprising:
   the optical element driving apparatus according to claim 1.

7. The projection optical system according to claim 6, further comprising:
   a barrel unit that accommodates the optical element, wherein the fixed portion is immovably fixed to part of the barrel unit.

8. The projection optical system according to claim 7, further comprising:
   a position adjustment member arranged between the barrel unit and the fixed portion to adjust the position of the fixed portion relative to the barrel unit.

9. The projection optical system according to claim 6, wherein the fixed portion is a barrel unit accommodating the optical element.

10. The projection optical system according to claim 6, further comprising:
    a barrel unit accommodating the optical element, wherein the damper mechanism is in contact with both the fixed portion and the barrel unit, and the fixed portion is attached to the barrel unit, via the damper mechanism.

11. An exposure apparatus that exposes a predetermined pattern on a substrate with the projection optical system according to claim 6.

12. A method for manufacturing a device, comprising a lithography process for performing exposure with the exposure apparatus according to claim 11.

13. The optical element driving apparatus according to claim 1, wherein the damper mechanism includes a resilient body that supports the mass body in a manner movable relative to the fixed portion, and a vibration suppressing member that reduces a movement amount of the mass body when the resilient body is resiliently deformed.

14. The optical element driving apparatus according to claim 1, wherein the damper mechanism further includes:
    a casing defining a hermetic chamber in which the mass body, the resilient body, and the vibration suppressing member are accommodated.

15. The optical element driving apparatus according to claim 14, wherein
    the vibration suppressing member is arranged between the mass body and the casing.

* * * * *